(12) United States Patent
Lee et al.

(10) Patent No.: US 8,351,291 B2
(45) Date of Patent: Jan. 8, 2013

(54) ELECTRICALLY PROGRAMMABLE FUSE MODULE IN SEMICONDUCTOR DEVICE

(75) Inventors: Lini Lee, Puchong (MY); Yen Hau Lee, Kelana Jaya (MY)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 13/102,061

(22) Filed: May 6, 2011

(65) Prior Publication Data

US 2012/0281450 A1 Nov. 8, 2012

(51) Int. Cl.
*G11C 17/18* (2006.01)
(52) U.S. Cl. .................. 365/225.7; 365/96; 365/100
(58) Field of Classification Search .............. 365/96, 365/225.7, 189.09, 100, 163, 189.07, 226, 365/210, 149, 189.11, 191
See application file for complete search history.

(56) References Cited

U.S. PATENT DOCUMENTS

| 7,405,590 | B1 * | 7/2008 | Kaneko ........................ 326/38 |
| 7,477,555 | B2 | 1/2009 | Anand et al. | |
| 7,668,033 | B2 * | 2/2010 | Mori et al. ................. 365/225.7 |
| 7,724,600 | B1 | 5/2010 | Im et al. | |
| 8,072,831 | B2 * | 12/2011 | Takase et al. ............. 365/225.7 |
| 2003/0117829 | A1 | 6/2003 | Ronza | |
| 2005/0162799 | A1 * | 7/2005 | Anand et al. ................. 361/115 |
| 2007/0237018 | A1 | 10/2007 | Kenkare | |
| 2010/0188881 | A1 | 7/2010 | He | |

* cited by examiner

*Primary Examiner* — Dang Nguyen
(74) *Attorney, Agent, or Firm* — Charles Bergere

(57) ABSTRACT

A semiconductor device has an e-fuse module and a programming current generator. The e-fuse module includes an array of electrically programmable e-fuse elements. The programming current generator has a set of reference transistor elements, a selector for actuating the reference transistor elements to generate a selected reference current, and a current mirror for applying a programming current that is a function of the selected reference current to a selected e-fuse element of the array to program the resistance of the e-fuse element.

4 Claims, 3 Drawing Sheets

US 8,351,291 B2

ELECTRICALLY PROGRAMMABLE FUSE MODULE IN SEMICONDUCTOR DEVICE

BACKGROUND OF THE INVENTION

The present invention is directed to an electrically programmable fuse ("e-fuse") module in a semiconductor device.

An integrated circuit semiconductor device ("IC") may include one or more e-fuse modules, which can provide non-volatile memory (NVM) for data. E-fuse modules include arrays of fuse elements that can be individually programmed electrically (i.e., blown) after manufacture of the IC, and even after delivery of the manufactured IC, to define corresponding bits of the stored data as asserted or de-asserted. E-fuse modules may be used to store lot number and security data on the IC or to configure interconnections of elements of a field-programmable gate array (FPGA) by the customer or designer after manufacturing.

An e-fuse module may be programmed by applying a relatively high current briefly to change the original resistance of selected e-fuse elements, defined by design and manufacturing parameters, to a programmed resistance that is a function of the programming current. The programming current typically produces a substantial increase in the resistance of the e-fuse element, although the programming current reduces the resistance of the fuse elements in the case of anti-fuses, for example. The difference of resistance between the two states of an e-fuse element is typically at least an order of magnitude, and may for example be 200 Ohms in the low resistance state and 100,000 Ohms in the high resistance state.

An e-fuse module includes a programming current generator that provides an adjustable current for programming the elements of the e-fuse array. Control of the programming current controls the resistance of the programmed e-fuse elements. An e-fuse module also includes a sensing system that can be used to sense the resistance state of the individual elements of the e-fuse array to output stored data and/or for testing whether the asserted and de-asserted resistance states of the e-fuse elements are within specification.

It is known to use an array of reference resistors in generating an adjustable reference current or voltage for the programming current generator. However, such an array of reference resistors occupies an undesirably large area of the IC. Accordingly, it would be advantageous to have a more compact e-fuse module.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS

Figure 1:
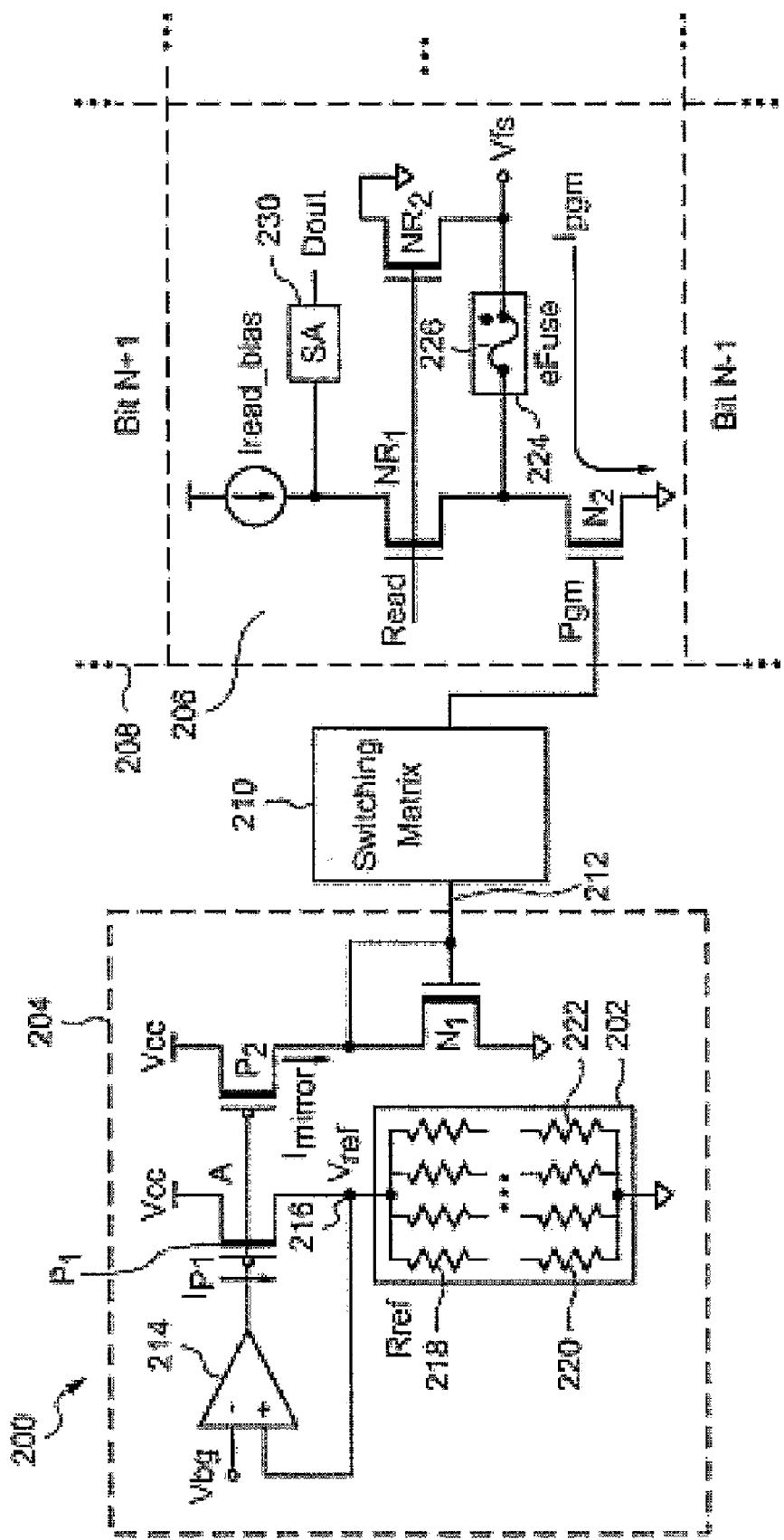
FIG. 1 is a simplified circuit diagram of a known semiconductor device including an e-fuse module.

FIG. 1 shows part of a known semiconductor device including an e-fuse module 200. The e-fuse module 200 includes an e-fuse reference link array 202. The reference link array 202 is in an e-fuse programming current generator 204 that is selectively coupled to an e-fuse cell ("bit") 206 in an e-fuse memory array 208 through a switching matrix 210. The switching matrix 210 selectively couples the output 212 of the e-fuse current generator 204 to one of several e-fuses in an e-fuse memory array 208 using word-line/bit-line techniques.

The switching matrix 210 is controlled by logic (not shown) that couples the output of the e-fuse programming current generator 204 to a selected e-fuse cell in the memory array for a selected period (i.e., for the desired programming time, Tpgm). The e-fuses in the memory array that are to be programmed are programmed sequentially (one at a time) using the e-fuse programming current generator 204.

The e-fuse programming current generator 204 has an operational amplifier (OpAmp) 214 that compares a reference voltage $V_{REF}$ at node 216 with a band gap voltage source Vbg that provides a stable voltage. The reference voltage $V_{REF}$ is established by the current $I_{P_1}$ through transistor P1 and the resistance of the e-fuse reference link array 202. The OpAmp 214 does not draw input current, and drives the gate of P1 until Vbg=$V_{REF}$. The OpAmp 214 also drives the gate of P2 to produce a current Imirror that is essentially equal to Ip1 if the widths of P1 and P2 are identical, disregarding the slight additional series resistance of NI. Alternatively, Imirror may be scaled intentionally to be substantially greater than or less than $I_{P_1}$.

The e-fuse reference link array 202 has a plurality of reference links 218, 220, 222 that in combination provide a reference resistance Rref of the e-fuse reference link array. An e-fuse 224 in the e-fuse cell 206 has an e-fuse link 226 that is programmed (i.e., blown) by programming current from the e-fuse current generator 204 during a programming operation. The e-fuse links and the reference links are each defined in a layer of polysilicon, silicide polysilicon, or other suitable link material.

During programming, a fuse programming voltage (typically about 2 to about 4 volts) is supplied to Vfs in the e-fuse cell 206. The switching matrix 210 connects the output 212 of the e-fuse programming current generator 204 to a selected e-fuse cell 206 for a selected programming period, producing a programming pulse Pgm. The selected programming period and fuse programming voltage is previously determined by characterization of programmed e-fuse memory arrays. Transistor N2 in the e-fuse cell 206 is matched to N1 in the e-fuse programming current generator 204 to form a current follower. In other words, the current through N1 (which is essentially $I_{P_1}$ as discussed above) is equal to the programming current Ipgm through N2. N2 draws current Ipgm from Vfs to ground (or vice versa), programming the e-fuse link 226.

The resistance representing the logic value of the e-fuse 224 is sensed (read) using any of several known techniques. Typically, a word line/bit line technique is used to access a selected e-fuse cell (e.g., a READ signal is applied to $NR_1$ and $NR_2$, and the current Iread_bias through $NR_1$, the e-fuse 224 and $NR_2$ is sensed and optionally latched by a sense amplifier 230.

The e-fuse link 226 is a thin member of polysilicon or silicide that provides a relatively low resistance (e.g., about 200 Ohms) before programming, and a higher resistance after programming (e.g., greater than 2,000 Ohms).

An example of a particular application is to a field programmable gate array ("FPGA"), whose e-fuse module may have a variety of types of e-fuses and a plurality of e-fuse programming current generators such as 204, each programming current generator having a reference link array 202 with reference links appropriate for use with the type of e-fuse in the associated memory array.

The reference link array 202, comprising sets of resistors, occupies a substantial area on a semiconductor chip. The area occupied is especially large if several reference link arrays 202 are provided, for example one for every column in the e-fuse array.

Figure 2:
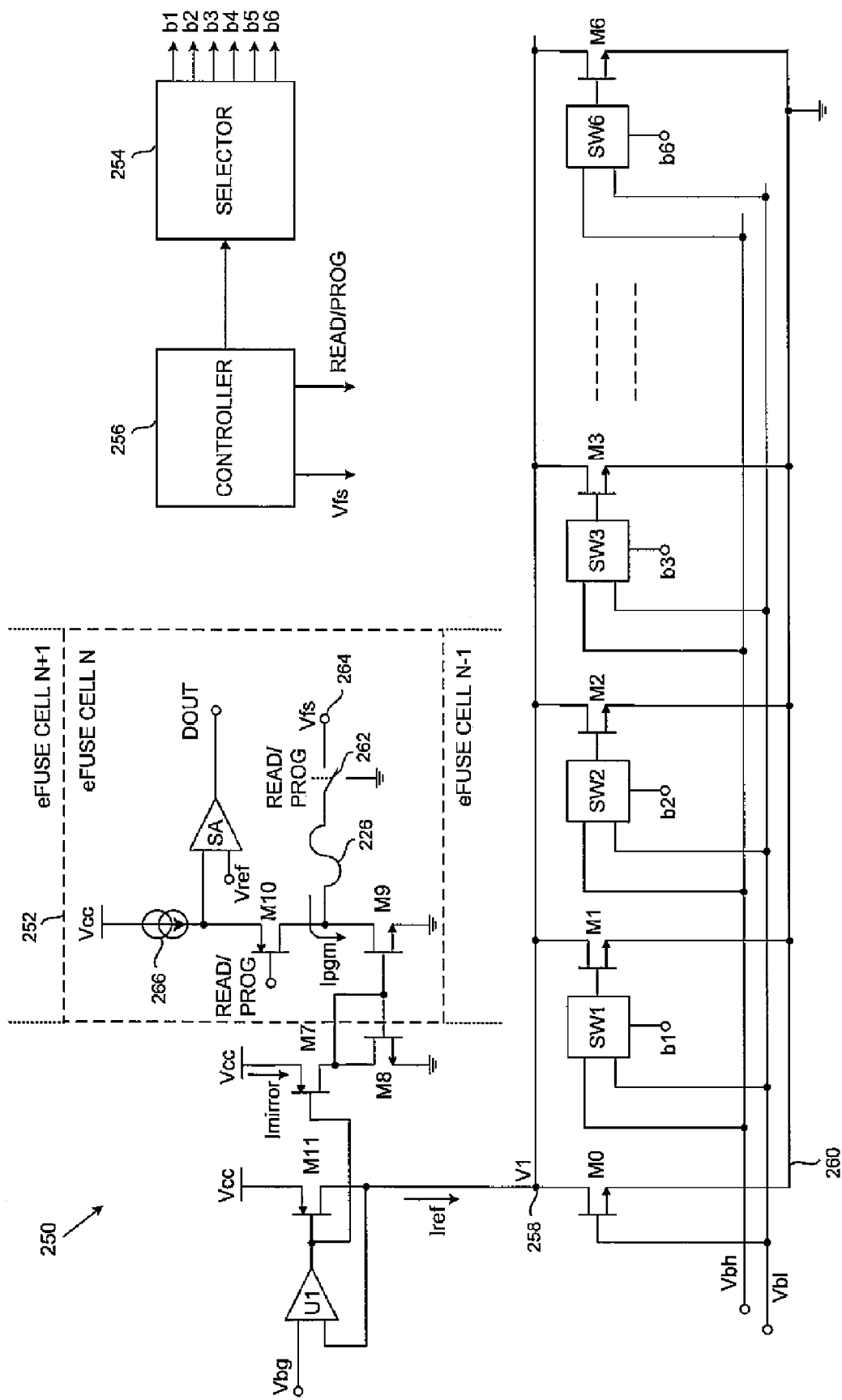
FIG. 2 is a simplified circuit diagram of a semiconductor device including an e-fuse module in accordance with one embodiment of the invention.

FIG. 2 illustrates an example of a semiconductor device comprising an e-fuse module and a programming current generator 250. The e-fuse module comprises an array of electrically programmable e-fuse cells such as 252 comprising e-fuse elements such as 226. The programming current generator 250 comprises a set of reference transistor elements M0 to M6, a selector 254 for actuating the reference transistor elements M0 to M6 to generate a selected reference current Iref, and a current mirror M7, M8, M9 for applying a programming current Ipgm which is a function of the selected reference current Iref to a selected e-fuse element such as 226 of the array so as to program the resistance of the selected e-fuse element 226.

In more detail, in this example, a controller 256 couples the programming current generator 250 to a selected e-fuse cell such as 252 to apply the programming current Ipgm during a desired programming time Tpgm. The e-fuse cells are programmed sequentially using the e-fuse programming current generator 250.

The e-fuse programming current generator 250 comprises an amplifier U1 that compares a voltage V1 at node 258 with a voltage Vbg from a band gap voltage source which provides a stable reference voltage and applies a voltage corresponding to the difference to the control terminal of a transistor M11 whose source is connected to a power supply voltage Vcc and whose drain is connected to the node 258. The selector 254 applies signals b1 to b6 to switches SW1 to SW6, which select a high bias voltage Vbh or a low bias voltage Vbl to apply to the control terminals of the respective transistors M1 to M6 for controlling flow of current in their current conduction paths. The current conduction paths of the transistors M0 and M1 to M6 are connected in parallel between the node 258 and a node 260, which is connected to ground in this example. The current conduction paths of the transistors M0 to M6 may be chosen to have selected different widths and lengths so that the current conduction paths of the transistors M0 to M6 pass selected defined currents when the high or low bias voltage Vbh or Vbl is applied to their control terminals when the defined voltage V1 is applied to their drains. The voltage V1 is established by the current Iref flowing through the transistor M11 and the parallel currents flowing in the transistors M0 to M6. The amplifier U1 drives the control terminal of the transistor M11 until the voltage V1 across the nodes 258 and 260 is equal to the reference voltage Vbg, that is to say that V1=Vbg.

The control terminal of the transistor M11 is also connected to the control terminal of a transistor M7 whose source is connected to the supply voltage Vcc and whose drain is connected to the drain of a transistor M8. The source of the transistor M8 is connected to ground and its control terminal is connected to its drain and to the control terminal of a transistor M9. The source of the transistor M9 is connected to ground and its drain is connected to one side of the e-fuse element 226 and to the drain of a transistor M10. The other side of the e-fuse element 226 is connected through a switch 262 either to a programming voltage supply terminal 264 or to ground as a function of a signal READ/PROG from the controller 256. The source of the transistor M10 is connected through a current source 266 to the voltage supply Vcc and to an input of a sense amplifier SA, whose other input receives a reference voltage V2 and whose output (which may be latched) is connected to provide a read output signal Dout.

The transistors M11, M7, M8 and M9 are connected in current mirror and current follower configuration. In operation, during programming the e-fuse cell 252, the amplifier U1 drives the voltage of the control terminal of the transistor M7 to the same voltage as that of the transistor M11 to produce a current Imirror that is essentially equal to the current Iref flowing through the current conduction path of the transistor M11 and the node 258 to the node 260 if the widths of M7 and M11 are identical, (except for the slight additional series resistance of the transistor M8). Alternatively, Imirror may be scaled intentionally to be substantially greater than or less than Iref.

During the programming phase, the controller 256 applies a signal READ/PROG to the switch 262 of the selected e-fuse cell 252, to connect the e-fuse element 226 to the terminal 264, and to the control terminal of the transistor M10 to turn it off. The controller 256 generates a programming voltage Vfs applied to the terminal 264 of the selected e-fuse cell 252 during the defined programming period Tpgm across the series connection of the current mirror/follower transistor M9 and the selected e-fuse element 262 of the array, the programming current Ipgm flowing through the series connection during the programming period to program the e-fuse element 226.

During the sensing phase, whether to test or output the state of the e-fuse elements such as 226, the controller 256 applies a signal READ/PROG to the switch 262 of the selected e-fuse cell 252, to connect one side of the e-fuse element 226 to ground instead of to the terminal 264, and to the control terminal of the transistor M10 to turn it on. The transistor M10 applies a sensing current from the current source 266 to the selected e-fuse element 226 of the array and the sense amplifier SA generates an output signal as a function of the difference between the reference voltage V2 at one input of the sense amplifier SA and the voltage across the e-fuse element 226, which is a function of the resistance of the e-fuse element 226 and the reference current from the constant current source 266.

It will be appreciated that the programming current generator 250 with the transistors M0 to M6 and the switches SW1 to SW6 can be provided in a much smaller area on a semiconductor chip than sets of resistors such as 202 in polysilicon or silicide, with associated switches.

Figure 3:
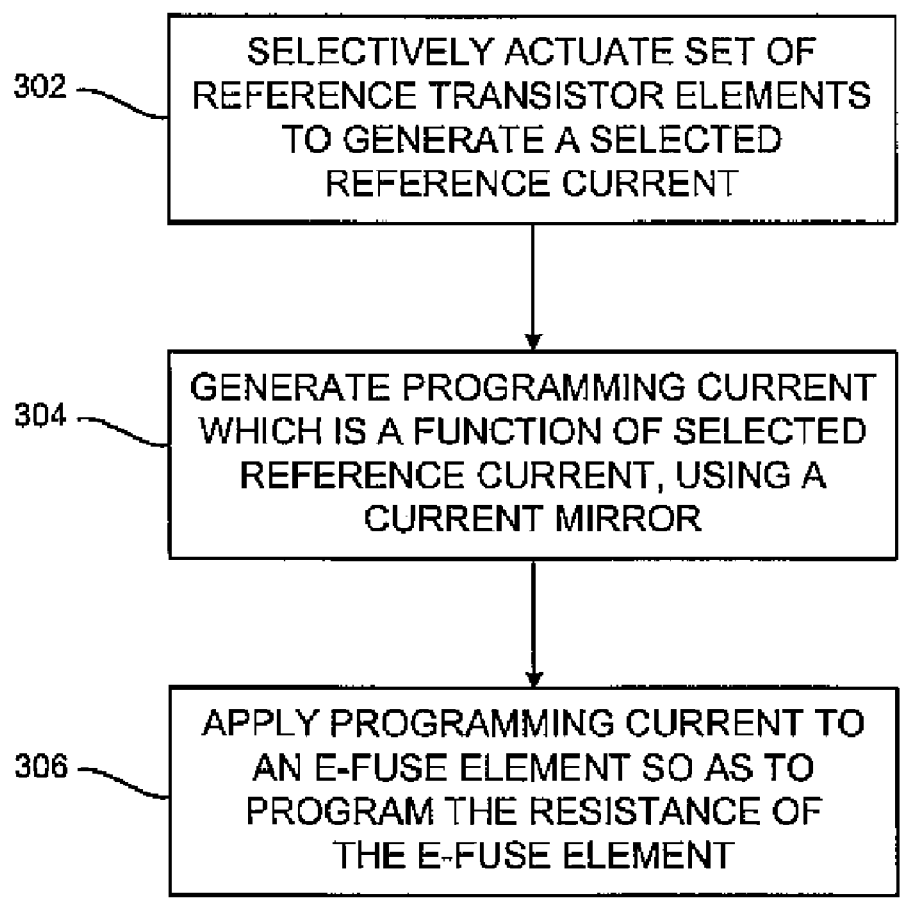
FIG. 3 is a simplified flow chart of a method of programming an e-fuse module in a semiconductor device in accordance with one embodiment of the invention.

FIG. 3 shows a simplified flow chart of a method 300 of programming an e-fuse module comprising an array of electrically programmable e-fuse elements 226 in a semiconductor device, in accordance with an example of an embodiment of the present invention. The method 300 comprises selectively actuating a set of reference transistor elements M0 to M6 at 302 to generate a selected reference current Iref. At 304, a programming current Ipgm is generated which is a function of the selected reference current Iref, using a current mirror M7 to M9. At 306, the programming current Ipgm is applied to an e-fuse element 226 of the array so as to program the resistance of the e-fuse element. The operation is repeated for the different e-fuse elements of the array in succession. Typically each e-fuse element is programmed individually but it may be possible in certain circumstances to program more than one e-fuse element simultaneously.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor device described herein can comprise any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Those skilled in the art will recognize that boundaries between the above described operations merely illustrative. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
   an e-fuse module including an array of electrically programmable e-fuse elements; and
   a programming current generator including a set of reference transistor elements, a selector for actuating said reference transistor elements to generate a selected reference current, and a current mirror for applying a programming current that is a function of said selected reference current to a selected e-fuse element of said array to program a resistance of said selected e-fuse element,
   and wherein the current mirror includes,
     a first transistor (M7) having a first terminal connected to a supply voltage (Vcc),
     a second transistor (M8) having a first terminal connected to a second terminal of the first transistor (M7), a second terminal connected to ground, and a control terminal connected to the second terminal of the first transistor (M7), and
     a third transistor (M9) having a first terminal connected to the e-fuse module for providing the programming current thereto, a second terminal connected to ground, and a control terminal connected to the control terminal of the second transistor (M8), and
   wherein the programming current generator further comprises:
     a current follower transistor (M11) having a first terminal connected to the supply voltage (Vcc), a second terminal connected to the set of reference transistor elements, and a control terminal connected to a control terminal of the first transistor (M7) of the current mirror, and an amplifier having a first input that receives a bandgap voltage, a second input connected to the second terminal of the current follower transistor (M11), and an output connected to the gate of the current follower transistor (M11).

2. The semiconductor device of claim 1, wherein each of said reference transistor elements has a current conduction path and a control terminal, and said selector applies selectively a first reference voltage or a second reference voltage to said control terminals of said reference transistor elements for controlling flow of current in said current conduction paths.

3. The semiconductor device of claim 2, wherein said current conduction paths of said reference transistor elements are connected in parallel between a first node and a second node, said selected reference current flowing between said first and second nodes.

4. The semiconductor device of claim 1, further comprising a sensor for applying a sensing current to an e-fuse element of said array and generating an output signal as a function of said resistance of said e-fuse element.

* * * * *